(12) United States Patent
Forstner et al.

(10) Patent No.: US 7,573,420 B2
(45) Date of Patent: Aug. 11, 2009

(54) RF FRONT-END FOR A RADAR SYSTEM

(75) Inventors: Hans Peter Forstner, Steinhoering (DE); Rudolf Lachner, Ingolstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/803,343

(22) Filed: May 14, 2007

(65) Prior Publication Data

US 2008/0287085 A1 Nov. 20, 2008

(51) Int. Cl.
*G01S 13/00* (2006.01)
(52) U.S. Cl. .................. 342/175; 342/70; 342/71; 342/72
(58) Field of Classification Search .......... 342/70–72, 342/175
See application file for complete search history.

(56) References Cited

U.S. PATENT DOCUMENTS

| | | | | |
|---|---|---|---|---|
| 4,931,799 A | * | 6/1990 | Wen et al. | 342/110 |
| 4,955,038 A | * | 9/1990 | Lee et al. | 375/256 |
| 5,495,255 A | * | 2/1996 | Komatsu et al. | 342/175 |
| 6,404,381 B1 | * | 6/2002 | Heide et al. | 342/109 |
| 6,411,252 B1 | * | 6/2002 | Grace | 342/174 |
| 6,522,285 B2 | * | 2/2003 | Stolarczyk et al. | 342/22 |
| 6,577,270 B2 | * | 6/2003 | Kanechika et al. | 342/199 |
| 6,720,908 B1 | * | 4/2004 | Puglia | 342/70 |
| 6,924,762 B2 | * | 8/2005 | Miyake et al. | 342/70 |
| 6,931,245 B2 | * | 8/2005 | Fikart | 455/323 |
| 6,967,619 B2 | * | 11/2005 | Khoo et al. | 343/700 MS |
| 7,002,511 B1 | * | 2/2006 | Ammar et al. | 342/134 |
| 7,079,869 B2 | * | 7/2006 | Aytur et al. | 455/562.1 |
| 7,089,032 B2 | * | 8/2006 | Hongo et al. | 455/550.1 |
| 7,146,136 B2 | * | 12/2006 | Consolazio | 455/73 |
| 7,161,526 B2 | * | 1/2007 | Cornic et al. | 342/27 |
| 7,167,125 B2 | * | 1/2007 | Gottwald et al. | 342/70 |
| 7,283,087 B2 | * | 10/2007 | Nalezinski et al. | 342/128 |
| 2002/0075181 A1 | * | 6/2002 | Kanechika et al. | 342/175 |
| 2002/0084932 A1 | * | 7/2002 | Iwatani et al. | 342/175 |
| 2003/0224801 A1 | * | 12/2003 | Lovberg et al. | 455/454 |
| 2007/0152871 A1 | * | 7/2007 | Puglia | 342/70 |
| 2008/0258964 A1 | * | 10/2008 | Schoeberl et al. | 342/189 |

FOREIGN PATENT DOCUMENTS

DE 103 14 558 10/2004
DE 10 2004 059 915 6/2006

OTHER PUBLICATIONS

A front-end of FMCW anticollision radar Jing Chunguang; Yang Xiaobo; Microwave and Millimeter Wave Technology, 2000, 2nd International Conference on. ICMMT 2000 Sep. 14-16, 2000 pp. 568-571.*

* cited by examiner

*Primary Examiner*—Thomas H Tarcza
*Assistant Examiner*—Peter M Bythrow
(74) *Attorney, Agent, or Firm*—Maginot, Moore & Beck

(57) ABSTRACT

An RF sender/receiver front-end is disclosed comprising a terminal for receiving an oscillator signal, at least one distribution unit for distributing the oscillator signal into different signal paths, two or more mixer-arrangements for sending a transmit-signal or for receiving an receive-signal, where each mixer-arrangement comprises a mixer and an amplifier for amplifying the oscillator signal and generating the transmit-signal.

14 Claims, 10 Drawing Sheets

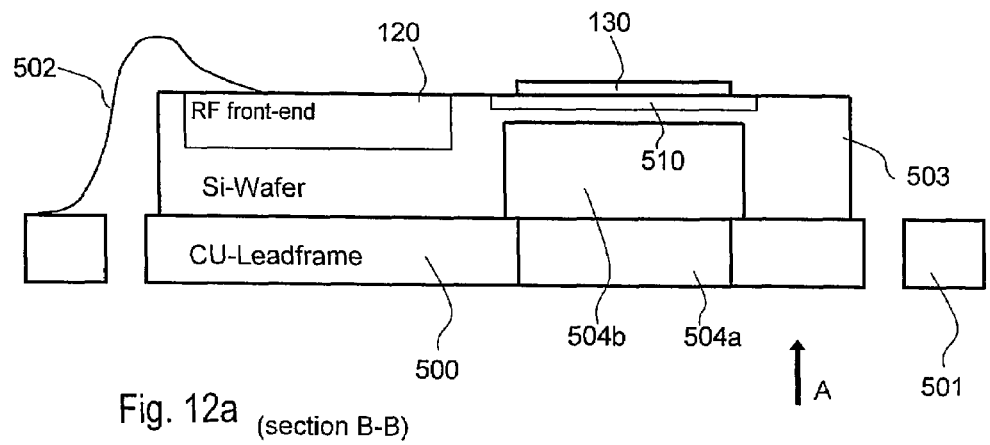
Fig. 12a (section B-B)
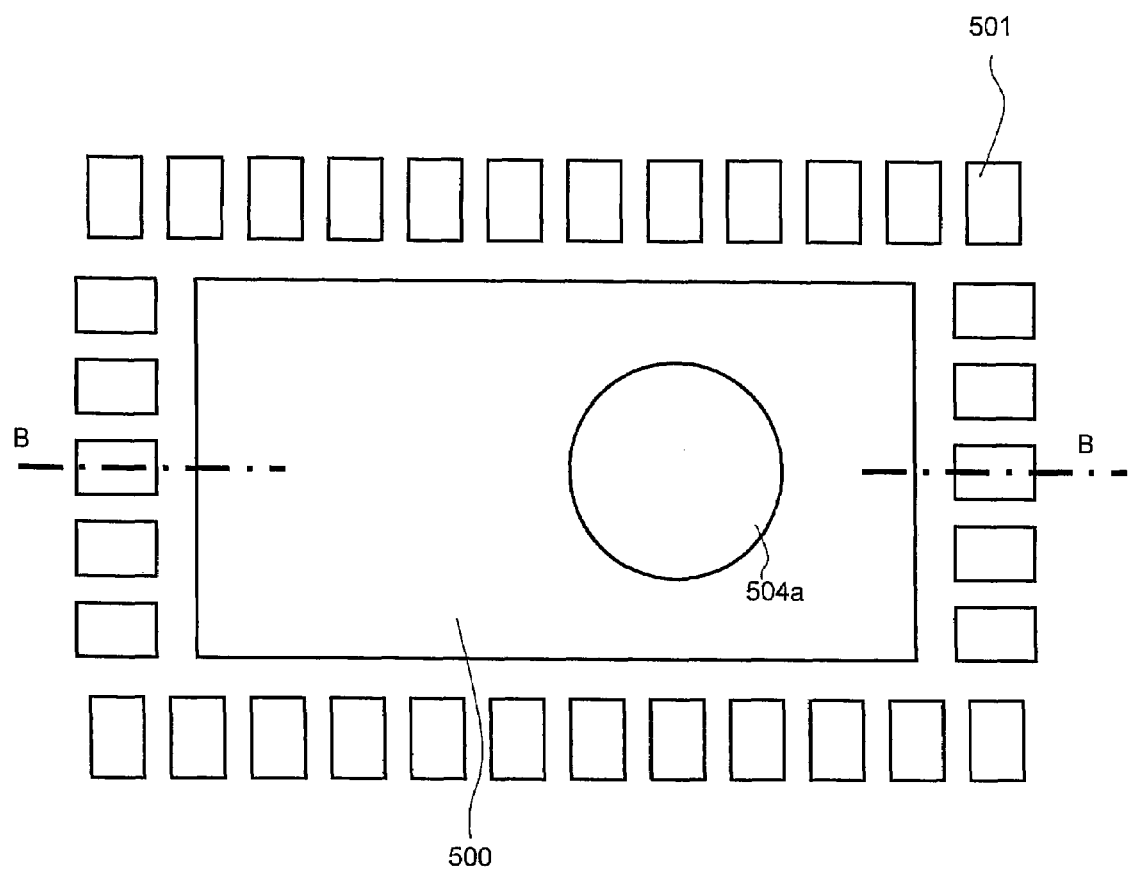
Fig. 12b (view A)

RF FRONT-END FOR A RADAR SYSTEM

TECHNICAL FIELD

The invention relates to a radio frequency sender/receiver front-end for a radar system.

BACKGROUND

Known radar systems which are currently used for distance measurement in vehicles essentially comprise two separate radars which operate in different frequency bands. For distance measurements in a near area (short range radar), radars which operate in a frequency band around a mid-frequency of 24 GHz are commonly used. In this case, the expression "near area" means distances in the range from 0 to about 20 meters from the vehicle (short range radar). The frequency band from 76 GHz to 77 GHz is currently used for distance measurements in the "far area", that is for measurements in the range from about 20 meters to around 200 meters (long range radar). These different frequency bands are antithetical to the concept of one single radar system for both measurement areas and often require two separate radar devices.

The frequency band from 77 GHz to 81 GHz is likewise suitable for short range radar applications. A single multi-range radar system which carries out distance measurements in the near area and far area using a single radio-frequency transmission module (RF front-end) has, however, not yet been feasible for various reasons. One reason is that circuits which are manufactured using III/V semiconductor technologies (for example gallium-arsenide technologies) are used at the moment to construct known radar systems. Gallium-arsenide technologies are admittedly highly suitable for the integration of radio-frequency components, but it is not possible to achieve a degree of integration which is as high, for example, of that which would be possible with silicon integration, as a result of technological restrictions. Furthermore, only a portion of the required electronics are manufactured using GaAs technology, so that a large number of different components are required to construct the overall system.

However, a high number of components is not desirable, since losses and reflections arise in each component, especially in the signal path downstream to the RF power amplifier. These losses and reflections have an undesired negative impact on the efficiency of the overall system. Thus there is a general need for a RF sender/receiver front-end which provides for high flexibility at high integration level and high efficiency.

SUMMARY

The RF sender/receiver frontend according to one example of the invention comprises a terminal for receiving an oscillator signal, at least one distribution unit for distributing the oscillator signal into different signal paths, two or more mixer-arrangements for sending a transmit-signal or for receiving an receive-signal, where each mixer-arrangement comprises a mixer and an amplifier for amplifying the oscillator signal and generating the transmit-signal.

One aspect of at least some embodiments of the invention relates to a mixer-arrangement. An exemplary embodiment of the mixer-arrangement comprises an oscillator terminal for receiving an oscillator signal, an RF terminal for connecting an antenna, a base-band terminal for providing a base-band signal, a mixer having a first input which is connected to the oscillator terminal, a second input, and an output which is connected with the base-band terminal, a directional coupler which is connected with the oscillator-terminal and the RF terminal for coupling the oscillator signal to the antenna and for coupling a signal received from the antenna to the second input of the mixer, and a disconnecting device for interrupting the signal.

The amplifier of the sender/receiver front-end may be able to be enabled and disabled by a control signal. In this case the amplifier may also serve as the disconnecting device of the mixer arrangement.

With the help of the mixer arrangement the RF sender/receiver front-end may be configured to operate either in a pure receive-mode or in a combined send-and-receive-mode of an antenna which is connected to the RF front-end.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 12a shows a cross-section of an example of the invention, where RF-front-end of FIG. 11 and an antenna are arranged in one common package.

FIG. 12b shows a bottom-view of the arrangement of FIG. 12a.

DETAILED DESCRIPTION

Figure 1:
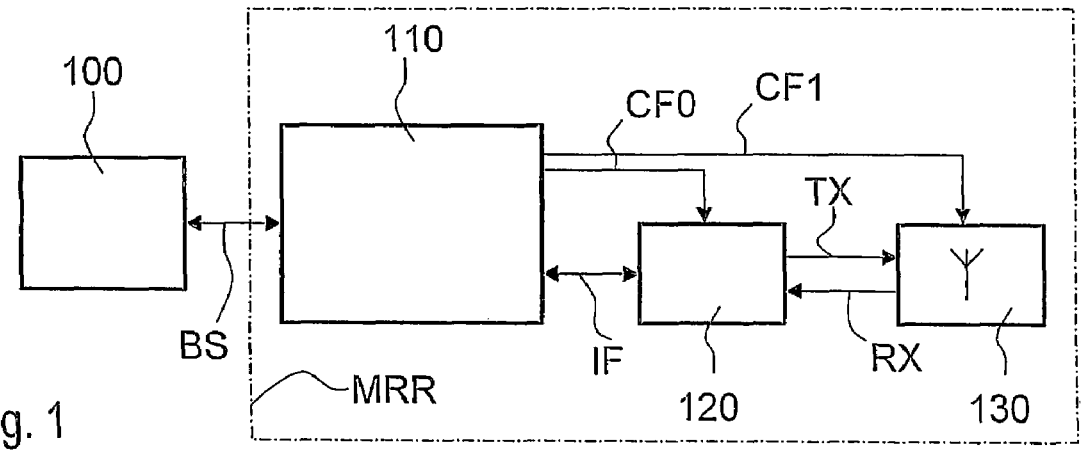
FIG. 1 shows a radar system in which the same antenna is used for long-range and short-range measurements.

FIG. 1 uses a block diagram to show the basic structure of one example of a radar system. The actual multirange radar MRR has a control and processing unit 110 which is connected to the other vehicle components 100 via a specific interface, for example the vehicle bus. The multirange radar MRR also comprises a radio-frequency (RF) transmission module 120 and an antenna module 130 which comprises one or more individual antennas. The control and processing unit 110 may be designed predominantly using CMOS technology, whereas the RF transmission module 120 may be designed predominantly using bipolar technology. However, it is also possible to integrate both parts jointly using BiCMOS technology. The multirange radar comprises at least two range measurement zones, a near area for ranges between 0 and about 20 meters (short-range radar), and a far area with ranges from around 20 meters to about 200 meters (long-range radar). Since both the transmission and reception characteristics of the active antennas as well as the required bandwidth of the transmitted radar signal are different in these two measurement ranges, both the antenna module 130 and the radio-frequency transmission module 120 can be configured by means of control signals CF0 and CF1, which are provided by the control and processing unit 110, in accordance with the desired measurement range. The details of this configuration capability will be explained in more detail further below.

An antenna with a fairly broad emission angle is desirable for a measurement in the short range and an antenna with a narrow emission angle and a high antenna gain is desirable for measurement in the long range. For this reason, phased-array antennas may be used, by way of example, in the antenna module 130, whose transmission/reception angle can be varied by driving different antenna elements with the same antenna signal, but with a different phase angle of the antenna signal. Variation of the transmission and reception characteristics of antennas by means of an appropriate driver is also referred to as electronic beam-control or digital beam-forming.

The RF transmission module 120 also comprises the radio-frequency front-end which is required for the reception of the reflected radar signals. The received radar signals are mixed to baseband with the aid of a mixer, the baseband signal IF is then supplied from the radio-frequency transmission module 120 to the control and processing unit 110, which digitizes the baseband signal IF and processes it further by digital signal processing. It is not only possible to provide a separate transmitting antenna and receiving antenna (bistatic radar), but also a common antenna for transmission and reception of radar signals (monostatic radar). In the second case, a directional coupler is required to separate the transmitted signals and the received signals. The internal design of the RF transmission module 120 and of the antenna modules 130 will likewise be described in more detail later.

Electronic beam control (digital beam-forming) allows a minimal number of components, but requires considerably greater control logic complexity. For this reason, different antennas 130a and 130b may be used for the different measurement ranges, as is shown in the example illustrated in FIG. 2. The block diagram in FIG. 2 differs from that in FIG. 1 only in that two antenna modules 130a and 130b are provided instead of the antenna module 130 which can be configured via the control signal CF1, and their emission and reception characteristics are not adjustable. For example, the antenna 130a is designed only for measurements in the short range, and the antenna 130b is designed only for measurements in the long range. However, the transmission signals are generated and the received signals are mixed in a common radio-frequency sender/receiver front-end 120. In principle, when using two antennas, it is also possible to simultaneously carry out measurements in the short range and in the long range (frequency multiplexing mode) instead of alternate measurement (time multiplexing mode).

Figure 2:
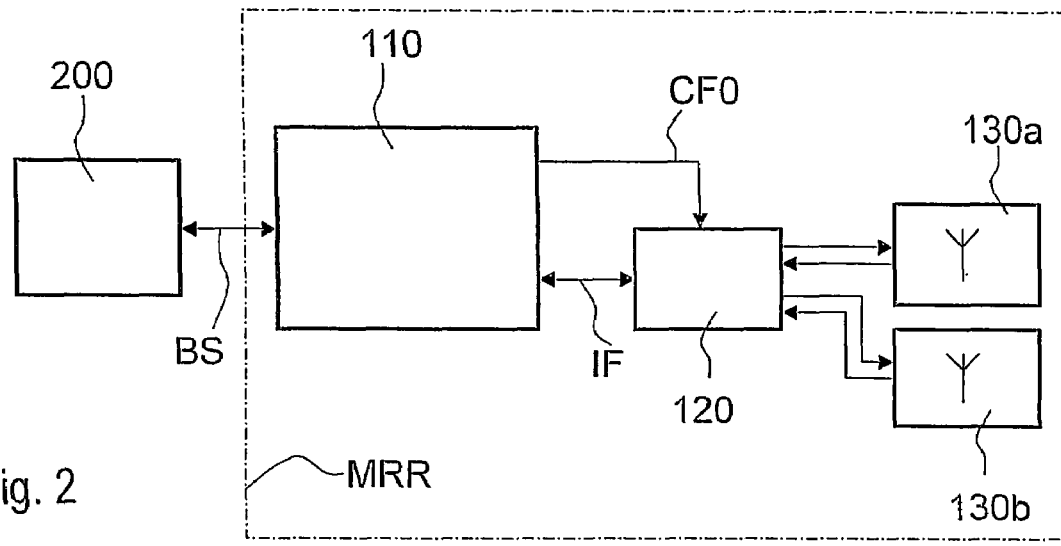
FIG. 2 shows a radar system with different antennas for long-range and short-range measurements.
Figure 3:
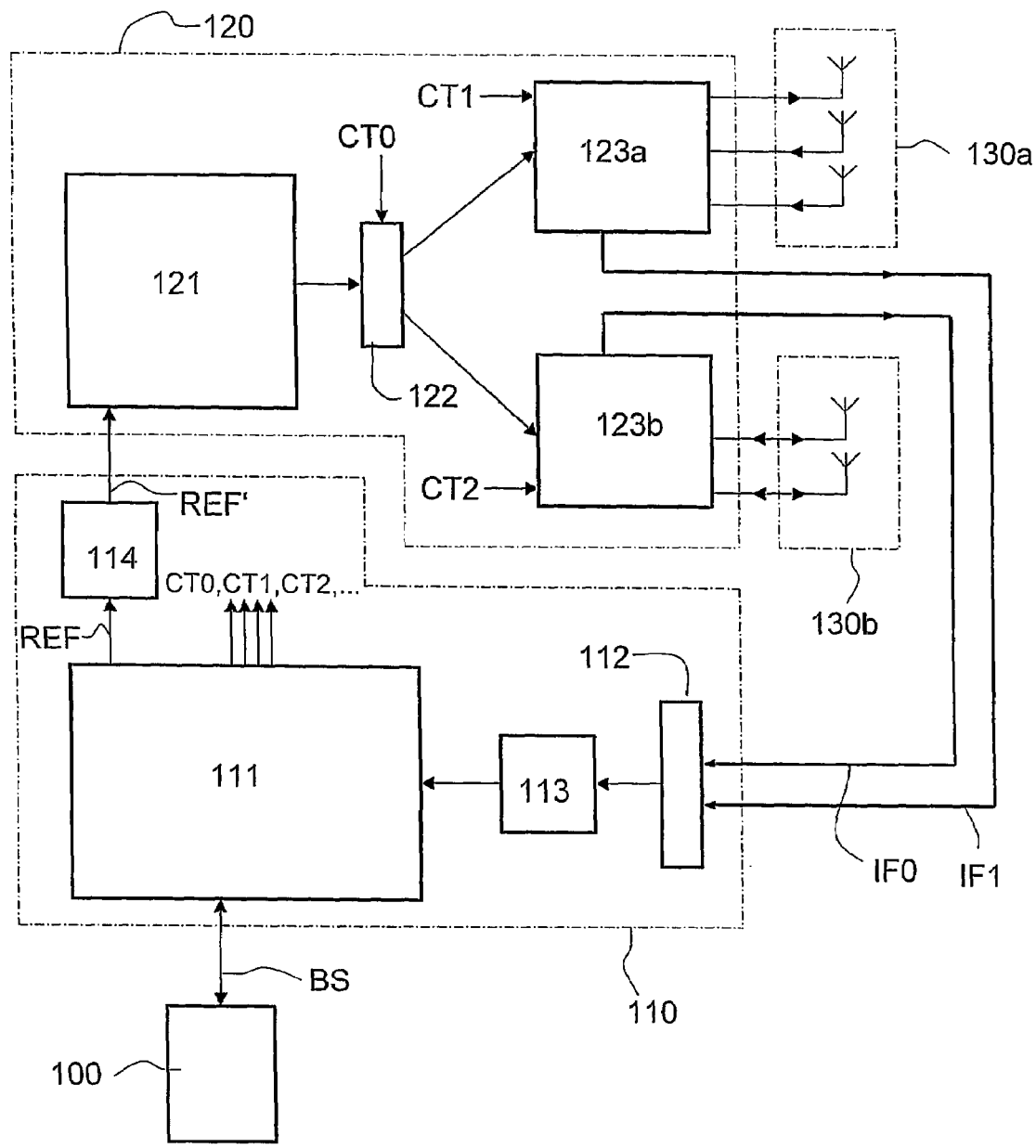
FIG. 3 shows a more detailed illustration of the system shown in FIG. 2.

FIG. 3 shows essentially the same example as illustrated in FIG. 2, but with the control and processing unit 110 and the RF sender/receiver front-end 120 being illustrated in more detail. The control and processing unit 110 comprises a computation unit 111, a digital/analog converter 114, an analog/digital converter 113 with an upstream distribution block 112 which, for example, may be in the form of a multiplexer. The RF sender/receiver front-end 120 comprises a radio-frequency oscillator 121, which produces the transmission signal, a distribution unit 122 which distributes the signal power, depending on the operating mode, to a first transmitting/receiving circuit 123a or to a second transmitting/receiving circuit 123b (time multiplexing mode), or else between both transmitting/receiving circuits 123a and 123b (frequency multiplexing mode).

As already mentioned, the multirange radar comprises a first operating mode for measurement of distances in the short range, and a second operating mode for measurement of distances in the long range. The operating mode is elected by the computation unit 111 by providing the appropriate control signals CT0, CT1 and CT2. The control signals CT1 and CT2 respectively activate and deactivate the respective transmitting/receiving circuits 123A and 123B, and the control signal CT0 configures the distribution unit 122 in accordance with the desired operating mode. The computation unit 111 additionally provides a digital reference signal REF, which is supplied to the oscillator 121 via a digital/analog converter 114. This reference signal REF governs the oscillation frequency of the output signal OSZ of the oscillator 121, which is supplied to the distribution unit 122. For a measurement in the short range, the distribution unit 122 is configured in such a manner that the transmission signal is supplied only to the transmitting/receiving circuit 123a, which is activated by the control signal CT1. The second transmitting/receiving circuit 123b is deactivated by the control signal CT2. The transmitting/receiving circuits 123a and 123b essentially also comprise a transmission amplifier output stage via which the transmission signal is supplied to the respective antenna modules 1230a and 130b.

In addition, the transmitting/receiving circuit 123a contains one or more mixers with the aid of which the radar signals which are received by the receiving antennas are mixed to baseband. The baseband signal IF1 is then made available by the transmitting/receiving circuit 123a to the distributor block 112 in the control and processing unit 110. Depending on the number of receiving antennas, the baseband signal IF1 comprises a plurality of signal elements. The baseband signal IF1 is distributed by the distributor block 112 to an analog/digital converter 113, which has one or more channels, and is made available from this analog/digital converter 113 in digital form to the computation unit 111. This computation unit 111 can then use the digitized baseband signals IF1 to identify objects in the "field of view" of the radar, and to calculate the distance between them and the radar. This data is then made available via an interface, for example a vehicle bus BS, to the rest of the vehicle.

For a measurement in the long range, all that is necessary is switching in the distributor unit 122, activation of the transmitting/receiving circuit 123b and deactivation of the transmitting/receiving circuit 123a by means of the control signals CT0, CT1 and CT2. The transmission and reception then take place via the antennas 130b, which in the present case are in the form of common transmitting and receiving antennas. For this reason, a directional coupler is also required to separate the transmission signal and the received signal. What has been said for the first transmitting/receiving circuit 123a also, of course, applies analogously to the second transmitting/receiving circuit 123b. The detailed design of the transmitting/receiving circuits 123a and 123b will be explained with reference to a further figure.

The transmitting/receiving circuits 123a and 123b can be deactivated in various ways. In the simplest case, the circuits (or else only circuit elements) are disconnected from the supply voltage. It is also possible to switch off the mixers in the transmitting/receiving circuits. Irrespective of the specific manner in which the deactivation is accomplished, it is, however, necessary to ensure that the power of the transmission signal is not reflected, and therefore does not interfere with any other circuit components.

Figure 4:
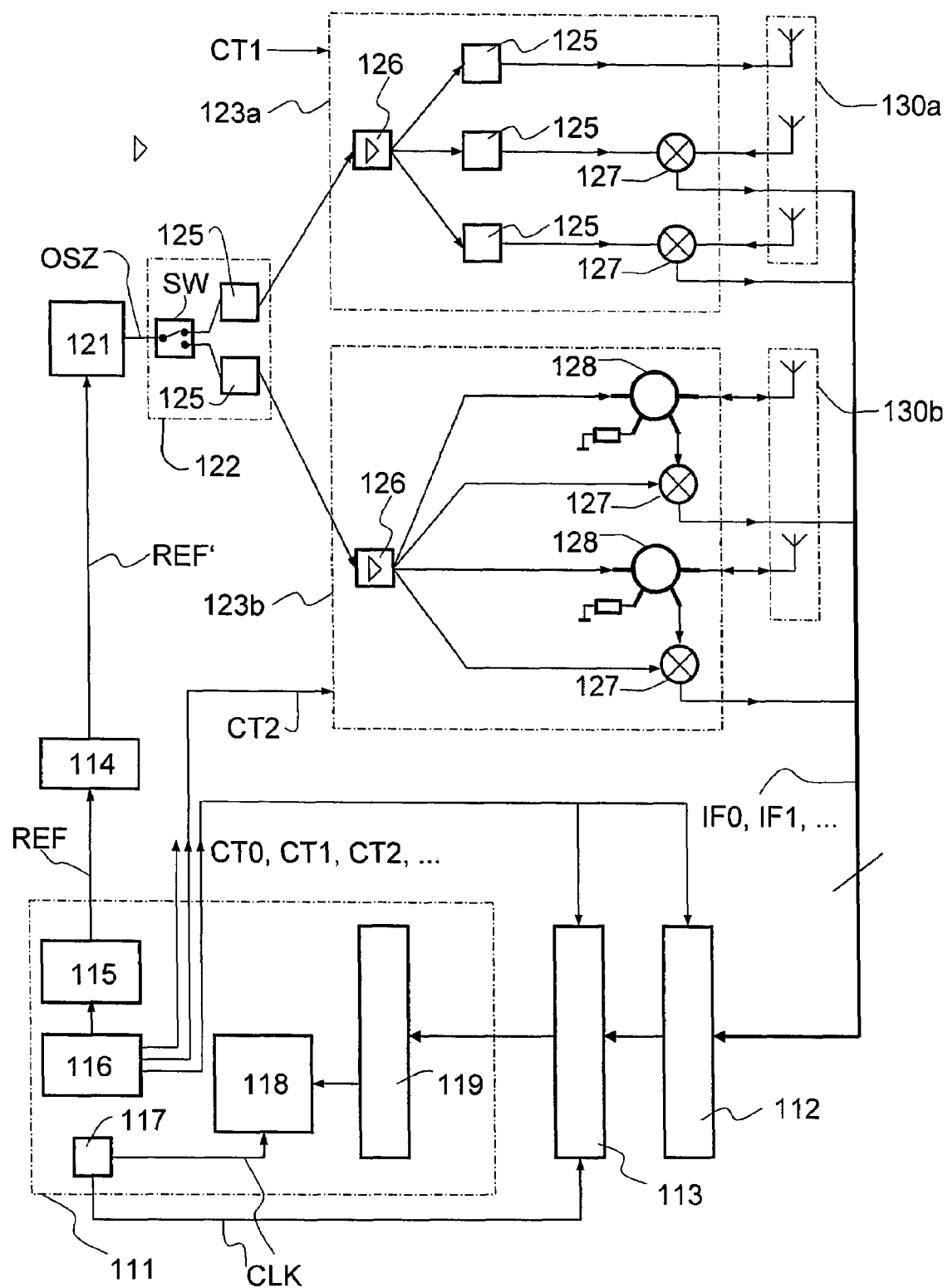
FIG. 4 shows a more detailed illustration of the system illustrated in FIG. 3.

FIG. 4 essentially shows the example of FIG. 3, with the computation unit 111, the distributor block 122 and the transmitting/receiving circuits 123a and 123b being illustrated in more detail. The transmitting/receiving circuits 123a and 123b each comprise an amplifier 126 to which the transmission signal is supplied. These amplifiers 126 have a plurality of outputs, at least one of which is connected to a transmitting antenna, and at least a second of which is connected to a mixer 127. If disturbance or interference signals which have to be filtered out are present, a filter 125 may be in each case arranged between the amplifier 126 and the transmitting antenna, and between the amplifier 126 and the mixer 127. In the transmitting/receiving circuit 123a, the mixers 127 are connected not only to the amplifier 126 but also to the receiving antenna, so that the received signal is mixed to baseband by the mixer 127 with the aid of the transmission signal.

In the illustrated example, one transmitting antenna and two receiving antennas are provided in the antenna module 130a. This should be regarded only by way of example, and in principle any desired combination of transmitting and receiving antennas is possible. Instead of separate transmitting and receiving antennas, it would also be possible to use bidirectional antennas, as is the case with the antenna module 130b.

The transmitting/receiving circuit 123b differs from the transmitting/receiving circuit 123a described above by comprising the directional couplers 128 which allow the antennas in the antenna module 138 to be used both as transmitting antennas and as receiving antennas. The directional couplers 128 have four connections, of which a first connection is connected to the amplifier 126, a second connection is connected to a terminating impedance, a third connection is connected to a mixer 127 and a fourth connection is connected to one antenna of the antenna module 130b. The transmission signal is passed from the amplifier 126 through the directional coupler to the antenna, where the signal power is emitted from. A received signal is passed from the antenna through the directional coupler to the mixer 127, where it is mixed to baseband with the aid of the transmission signal, which is likewise supplied to the mixer 127. The output signals from the mixers, i.e. the baseband signals IF0, IF1 are then multiplexed by the distributor block 112, and are digitized by the analog/digital converter 113. These digitized signals are buffered in a FIFO memory 119 and are processed further by a digital signal processor 118. The FIFO memory 119 and the digital signal processor 118 are components of the computation unit 111, as is the clock generator 117, which provides a clock signal for the digital signal processor 112 and for the analog/digital converter 113. The control logic 116 provides the control signals CT0, CT1 and CT2 and likewise controls a reference signal generator 115, which produces the digital reference signal REF for the oscillator 121 (see above).

The distribution unit 122, which distributes the oscillator signal OSZ to the transmitting/receiving circuits 123a and 123b, has only one switch SW in the illustrated situation, which may, for example, be in the form of a semiconductor switch or a micromechanical switch. This switch connects the oscillator 121 either to the first transmitting/receiving circuit 123a or to the second transmitting/receiving circuit 123b. Filters 125 are likewise arranged between the switch SW and the transmitting/receiving circuits 123a, 123b, provided that disturbing signals are present. It is also possible to connect the oscillator directly to the two transmitting/receiving circuits 123a and 123b (that is to say without the provision of a switch SW), or to provide a passive power splitter. The oscillator power is then split between the two transmitting receiving circuits. As already mentioned, it is important in this case to prevent reflections when one of the transmitting/receiving circuits 123a, 123b is deactivated. Suitable terminating impedances must therefore be provided at an appropriate circuit node.

The example illustrated in FIG. 4 is designed for a so-called time multiplexing mode, i.e. switching takes place alternately from the first operating mode to the second operating mode, and back again. The frequency ranges for measurements in the near area in the first operating mode and for measurements in the far area in the second operating mode may in this case in principle overlap, since only one of the two antenna modules 130a or 130b is ever active.

Figure 5:
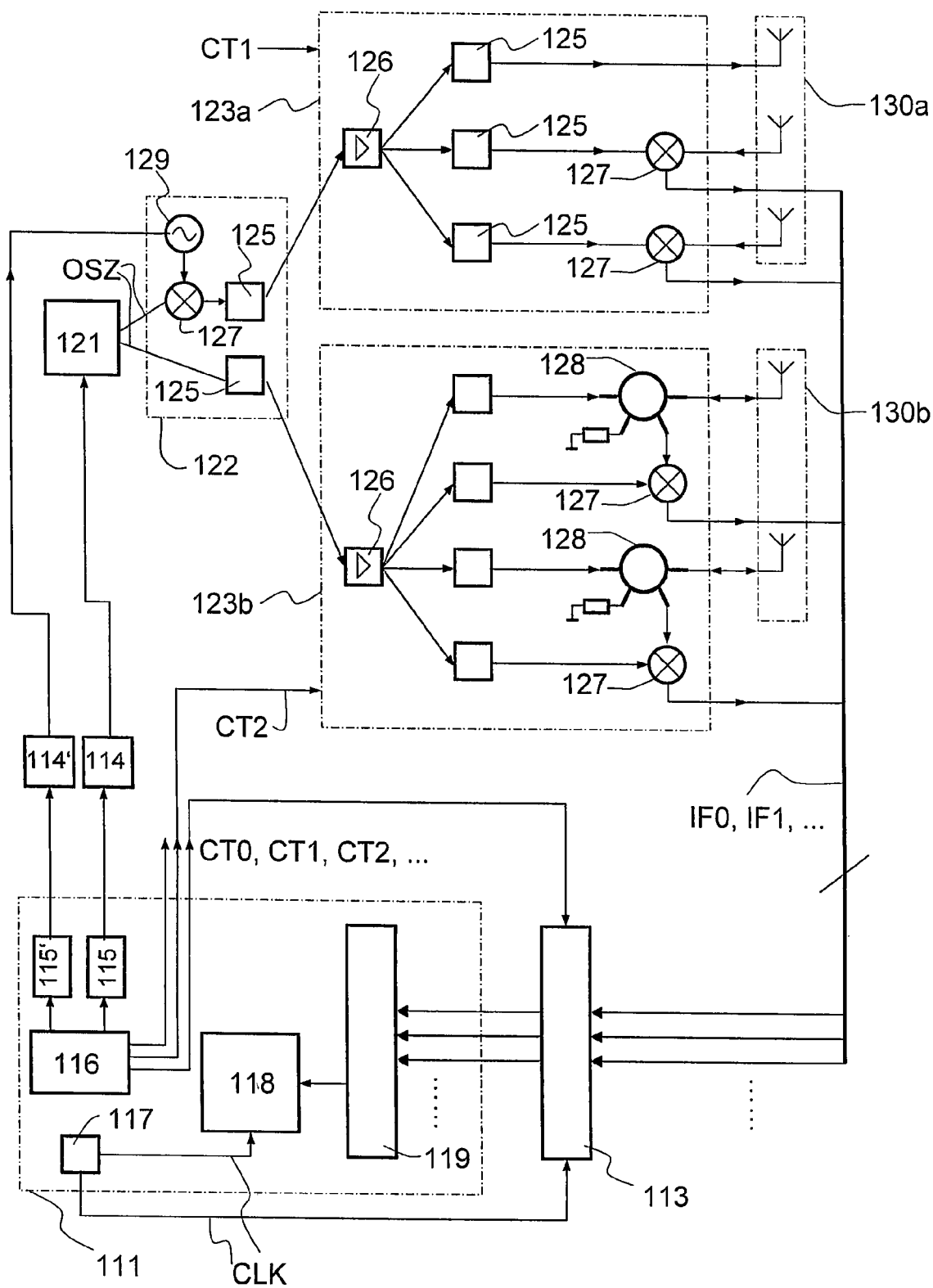
FIG. 5 shows an alternative to the system illustrated in FIG. 4.

FIG. 5 shows a very similar exemplary embodiment which operates using the frequency multiplexing mode. This differs from the exemplary embodiment shown in FIG. 4 only by having a modified distributor unit 122, the additional reference signal generator 115' with the additional digital/analog converter 114'. Since measurements are carried out simultaneously in the near area and in the far area in the frequency-division multiplexing mode, the multiplexer 112 may not be required in this case, but the analog/digital converters 113 would then have to comprise a plurality of channels in order to allow the received signals, which have been mixed to baseband, to be digitized in parallel.

In the example of FIG. 5, instead of a switch, the distributor unit 122 has an additional mixer 127 and an additional oscillator 129. The output signal OSZ from the oscillator 121 is on the one hand supplied to the mixer 127 in the distributor unit 122, and is on the other hand passed on via an optional filter 125 to the transmitting/receiving circuit 123b as well. The spectrum of the signal component of the oscillator signal OSZ supplied to the mixer 127 is frequency shifted by the oscillator frequency of the auxiliary oscillator 129, and is supplied via a filter 125 to the transmitting/receiving circuit 123a. The auxiliary oscillator 129 is likewise controlled by the computation unit 111 with the aid of the reference signal generator 115' and the digital/analog converter 114', which is connected to it and whose output signal is supplied to the auxiliary oscillator 129. The mixer 127 and the auxiliary oscillator 129 thus result in the production of a second, frequency-shifted transmission signal, so that the two transmitting/receiving circuits 123a can transmit and receive at the same at different frequencies via the two antenna modules 130a and 130b, respectively. This allows simultaneous measurement in the near area and in the far area.

Figure 6:
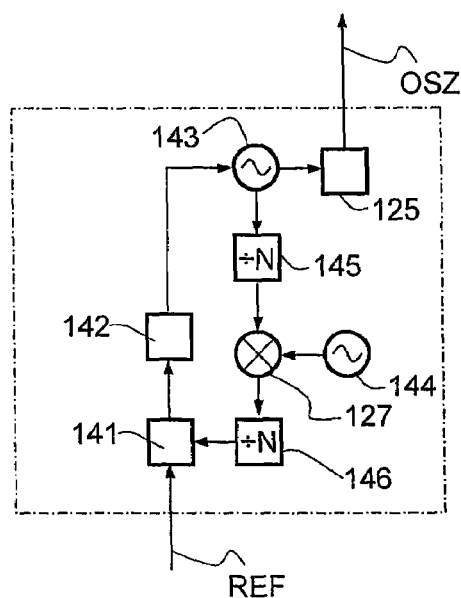
FIG. 6 shows the internal design of the transmission oscillator in the form of a block diagram.

FIG. 6 shows one possible configuration of the radio-frequency oscillator 121, with whose aid the transmission signal is produced. This essentially comprises a phase locked loop (PLL) to which the analog reference signal REF' which is produced by the digital/analog converter 114 is supplied. The major element of the phase locked loop is a voltage-controlled radio-frequency oscillator 143 whose output signal is supplied on the one hand to a frequency divider 145, and on the other hand to a filter 125. The output signal from the filter 125 represents the output signal OSZ from the phase-locked loop. The output signal from the frequency divider 145 is supplied to a mixer 127 which uses an auxiliary oscillator 144 to shift the spectrum of the frequency-divided oscillator signal by the magnitude of the frequency of the auxiliary oscillator 144 towards a lower value. The output signal from the mixer is divided down once again by a further frequency divider 146.

The output signal from this further frequency divider 146 thus represents the oscillator signal of the radio-frequency oscillator 143, which is compared with the previously mentioned reference signal REF' with the aid of the phase/frequency detector 141. This phase/frequency detector 141 produces a control voltage as a function of the frequency and phase difference between the output signal from the frequency divider 146 and the reference signal REF'. This control voltage is supplied to a loop filter 142, whose output is connected directly to the voltage-controlled radio-frequency oscillator 143. The voltage-controlled radio-frequency oscillator 143 is thus dependent on the phase difference and/or frequency difference between the output signal from the frequency divider 146, which represents the oscillator signal, and the reference signal REF'. The phase and the frequency of the output signal OSZ from the phase locked loop thus have a fixed relationship with the phase and the frequency of the reference signal REF'. The voltage-controlled radio-frequency oscillator 143 must be tunable over a broad frequency range, in the present case in the range from 76 GHz to 81 GHz, that is to say over a bandwidth of 5 GHz. Since the midfrequency can also be shifted by temperature effects and other parasitic effects, a bandwidth of 8 GHz or more is required in practice, and this can be achieved only by using the modern bipolar or BiCMOS technology that has already been mentioned further above.

As it can be seen in FIGS. 3 to 5 the antennas 130, 130a and 130b may either configured to be used as receiving antennas, as transmitting antennas, or as common transmitting/receiving antennas. With "transmitting-only" antennas the transmitting signal TX is generated from the oscillator signal OSZ of the voltage control oscillator by amplification, and the transmitting signal TX is supplied to the antenna. With the "receiving-only" antenna a mixer 127 is needed for receiving, the mixer is adapted for mixing a received signal RX into baseband and for providing the respective baseband signal IF. With a common transmitting/receiving antenna a directional coupler 128 is necessary for separating the received signal RX from the transmitting signal TX. The antennas—dependent on the application—may be arranged together with the RF front on one common lead frame in one common chip-package. FIGS. 12a and 12b refer to such an example.

As it can be seen from the example of FIG. 4 or 5, the oscillator signal OSZ in the transmitting/receiving circuit 123b (123a respectively) is amplified for providing the necessary signal power. The amplified RF oscillator signal is than supplied to the antennas and the mixers, wherein at each component (splitter, coupler, mixer, etc.) reflections and losses occur, which has a negative impact on the efficiency of the overall system.

Figure 11:
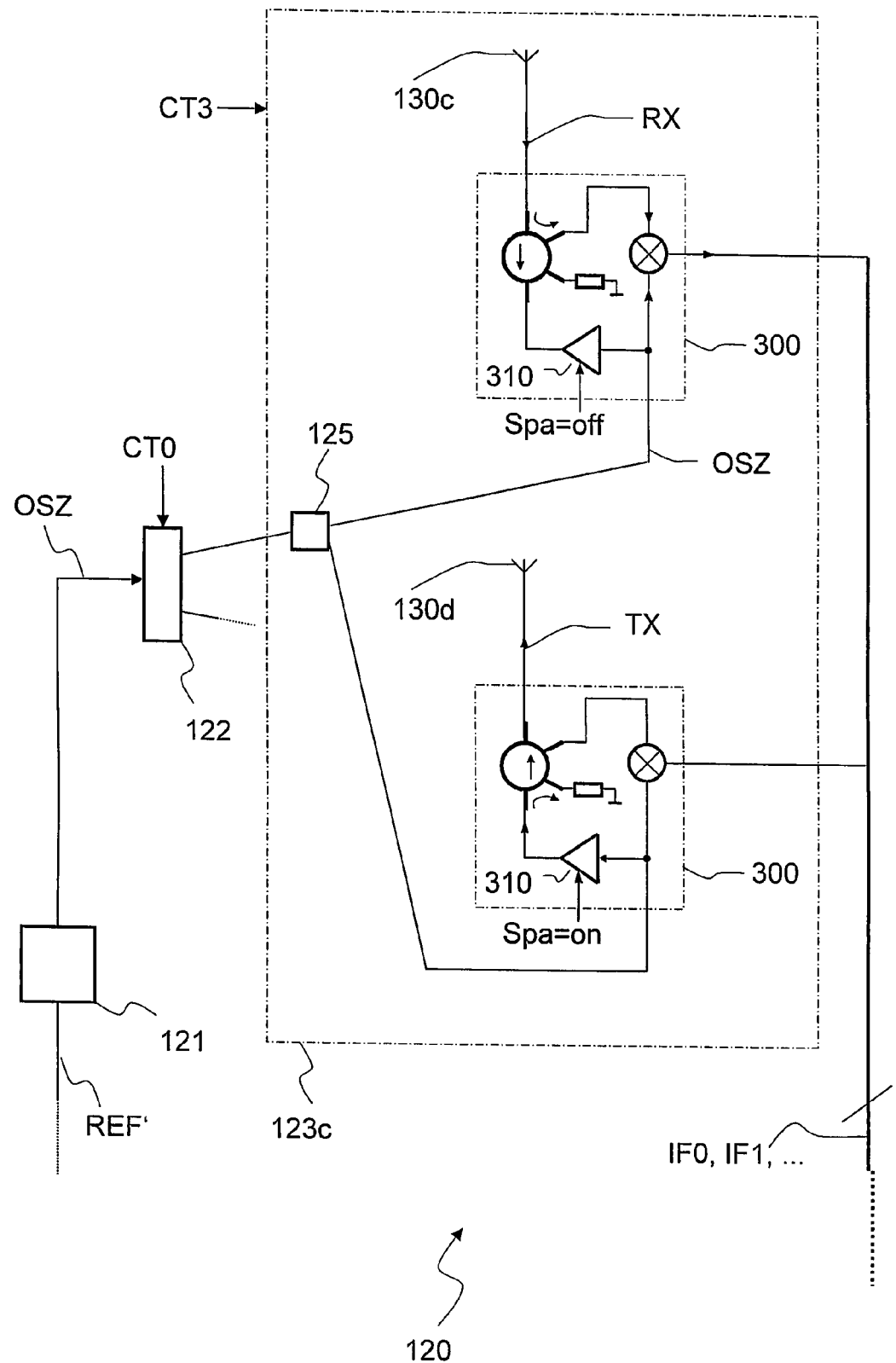
FIG. 11 shows one example of the inventive RF sender/receiver front-end comprising the configurable mixer of FIG. 8A or 8B.

Several different mixer arrangements 300 each comprising a directional coupler 128 and a mixer 127 are illustrated in FIG. 7 to 9. Such mixer arrangements 300 may be used, for example for designing a transmitting/receiving circuit similar to circuit 123b. Each of these mix arrangements 300 comprises an RF terminal 301, an oscillator terminal 302, and a baseband terminal 303. The oscillator signal OSZ (or alternatively an amplified oscillator signal) is supplied to the oscillator terminal 302; the RF terminal is connected to the antenna, which either emits a transmitting signal TX and/or receives an receiving signal RX. At the baseband terminal 303 a baseband signal IF is provided for further processing, wherein the baseband signal IF is generated by mixing the received signal RX and the oscillator signal OSZ. A transmitting/receiving circuit comprising such mixer arrangements 300 is depicted in FIG. 11 and labeled with the reference sign 123c. The transmitting/receiving circuit 123c may replace the transmitting/receiving circuits 123a or 123b of FIG. 3 or 4 for improving the efficiency of the overall system.

Figure 7A:
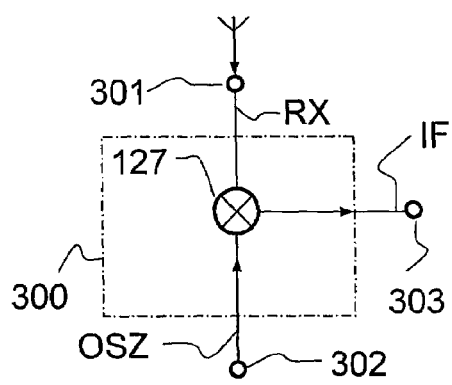
FIG. 7A shows a mixer-arrangement for mixing a RF receive-signal into the base-band.

The mixer arrangement depicted in FIG. 7a comprises a mixer 127 as its essential component. A first input of the mixer 127 is connected with the oscillator terminal 302 of the mixer arrangement 300, the oscillator signal of the voltage controlled oscillator being supplied to the oscillator terminal 302. A second input of the mixer 127 is connected with the RF-terminal 301, the received signal RX of the antenna being supplied to the RF-terminal 301. An output of the mixer 127 is connected with the baseband terminal 303 thus providing a baseband signal IF. The mixer arrangement described above obviously only can be employed for receiving; it is not possible to transmit signals.

Figure 7B:
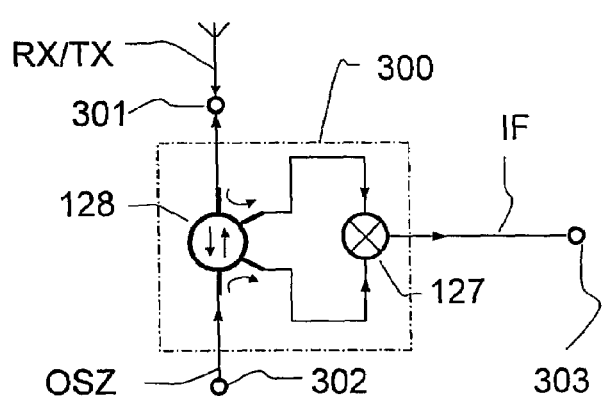
FIG. 7B shows a mixer-arrangement for a combined send-and-receive-mode of operation of a connected antenna.

If the antenna is supposed to be used as a common transmitting/receiving antenna, a directional coupler 128 has to be provided as depicted in FIG. 7b. The mixer arrangement 300 of FIG. 7b comprises an directional coupler 128 and a mixer 127 as its essential components. The oscillator signal is supplied to the oscillator terminal 302 of the mixer arrangement 300; the oscillator terminal 302 is connected with a first terminal of the directional coupler 128.

The oscillator signal OSZ is coupled by the directional coupler 128 to both the antenna as well as the mixer 127 as indicated by the arrows in FIG. 7b. The directional coupler 128 thus couples the oscillator signal OSZ incident at its first terminal to a fourth terminal of the directional coupler 128 and to a second terminal of the directional coupler 128. The fourth terminal is connected to the RF-terminal 301 and therefore to the antenna 130. The second terminal is connected with the first input of the mixer 127.

A received antenna signal RX arrives at the fourth terminal of the directional coupler 128 via the RF terminal 301 and is coupled by the directional coupler 128 to the mixer 127 via the third terminal of the directional coupler 128. The mixer 127 generates the baseband signal IF from the received antenna signal RX and the oscillator signal OSZ and provides the baseband signal IF at the base-band terminal 303 for further processing.

Figure 8A:
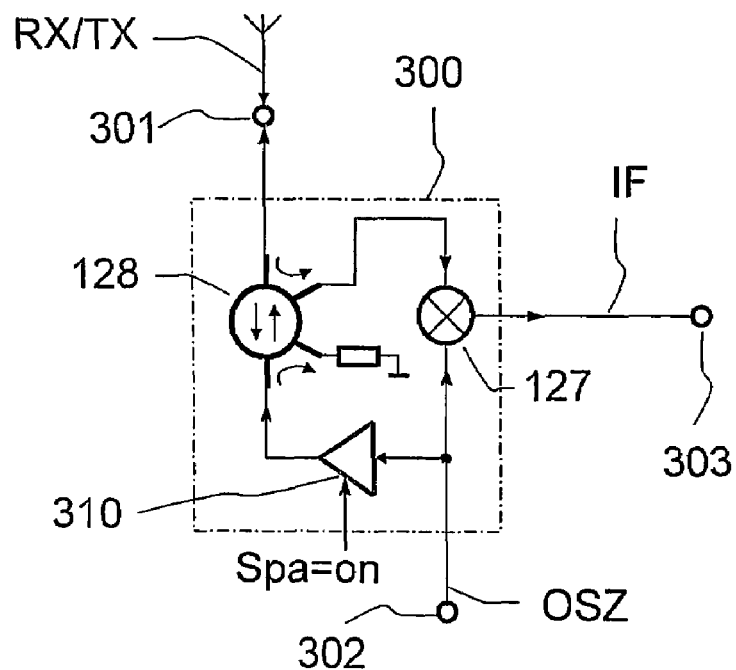
FIG. 8A shows a mixer-arrangement which is configured to a combined send-and-receive mode of operation, the mixer-arrangement being configurable by a control signal and comprising an amplifier which can be enabled and disabled by the control signal.
Figure 8B:
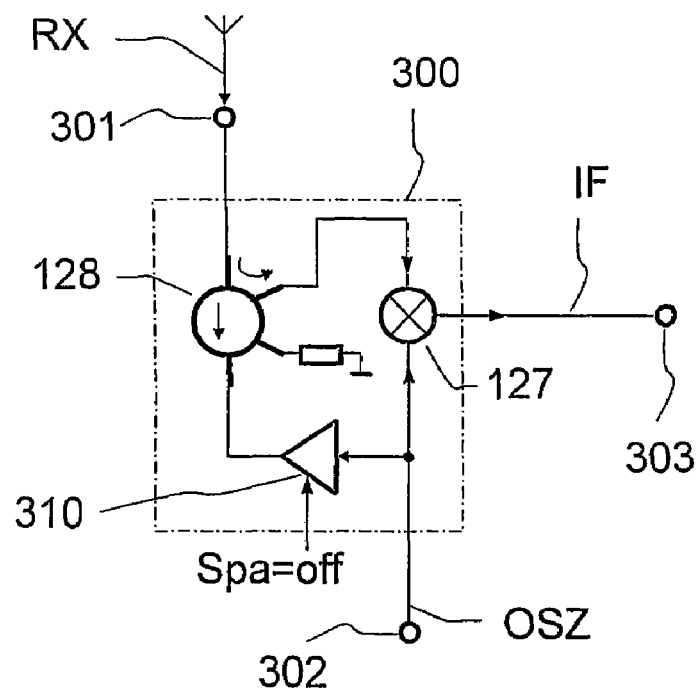
FIG. 8B shows a mixer-arrangement which is configured to a pure receive mode of operation, the mixer-arrangement being configurable by a control signal and comprising an amplifier which can be enabled and disabled by the control signal.

If the antenna configuration is to be varied or different applications require different system architectures (and therefore a different antenna- and mixer-configuration), then it is desirable, that these different mixer configurations do not require different hardware solutions, and that one mixer-hardware is configurable for a different applications. FIGS. 8a and 8b illustrate a mixer arrangement which is configurable (by switching) for a "receiving only" mode and a common transmitting/receiving mode. FIG. 8a illustrates the configuration and the signal flow for the common transmitting/receiving mode and FIG. 8b for the receiving-only mode.

The configurable mixer arrangement 300 of FIGS. 8a and 8b comprises a directional coupler 128, a mixer 127, a terminating impedance R, and a switchable, respectively configurable amplifier 310. Analogues to the mixer arrangements of FIGS. 7a and 7b the mixer arrangements 300 of FIGS. 8a and 8b comprise an RF-terminal 301, an oscillator terminal 302, and a baseband terminal 303. The RF-terminal 301 is connected with both the antenna and the fourth terminal of the directional coupler. The oscillator terminal 302 is connected with both the input of the amplifier 310 and the first input of the mixer 127, such that the oscillator signal OSZ, which is received by the oscillator terminal 302, is coupled to the mixer 127 as well as to the amplifier 310. The baseband terminal 303 is connected to the output of the mixer.

The output of the amplifier 310 is connected with the first terminal of the directional coupler 128. In the example of FIG. 8 the amplifier 310 can be enabled (Spa=on) and disabled (Spa=off) by a control signal Spa. The control signal Spa can assume two logic levels (on or off), according to which the amplifier is either activated or deactivated. With an activated amplifier 310 the oscillator signal is amplified and coupled to the fourth terminal of the directional coupler 128 and emitted as transmitting signal TX via the antenna. A part of the power of the oscillator signal is coupled to the terminating impedance R via the second terminal of the directional coupler 128. This terminating impedance R has to be chosen, such that no signal power is reflected.

The received signal RX received by the antenna is coupled via the directional coupler 128 (as indicated by the arrows) to the second input of the mixer 127, where the received signal RX is mixed with the oscillator signal OSZ for providing a base-band signal IF. A part of the signal power of the received signal RX is coupled via the directional coupler 128 to the output of the amplifier 310. The received signal RX has to be terminated at the amplifier output by means of a suitable terminating impedance for inhibiting undesired reflections.

FIG. 8b illustrates the case where the mixer arrangement 300 is configured as receiving-only mixer. Therefore, the amplifier 310 is deactivated by a corresponding level (Spa=off) of the control signal Spa and no transmitting signal is coupled to the antenna. The received signal RX is processed analogue to the case shown in FIG. 8a.

The mixer arrangements depicted in FIGS. 8a and 8b allow for a configuration of the operating mode of the mixer arrangement by a control signal Spa, the operating mode can be either the combined sending/receiving mode, or the receiving-only mode. Consequently, the same hardware component can be used with different system configurations. This is especially useful for chips comprising a plurality of mixer arrangements which are employed in different system configurations.

Figure 9A:
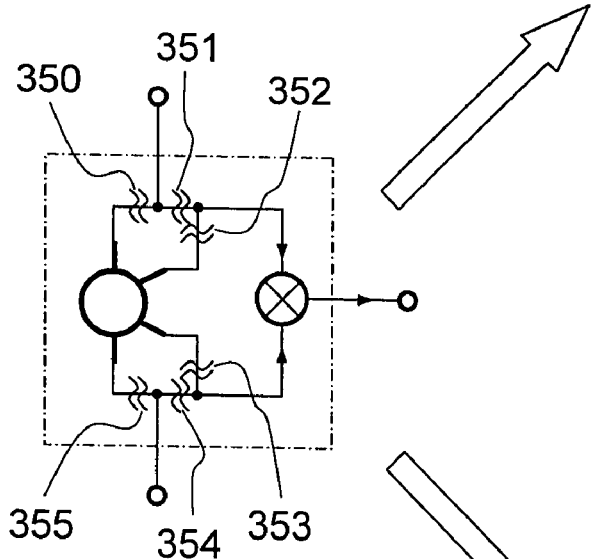
FIG. 9A shows a mixer-arrangement which is configurable by laser fuses.
Figure 9B:
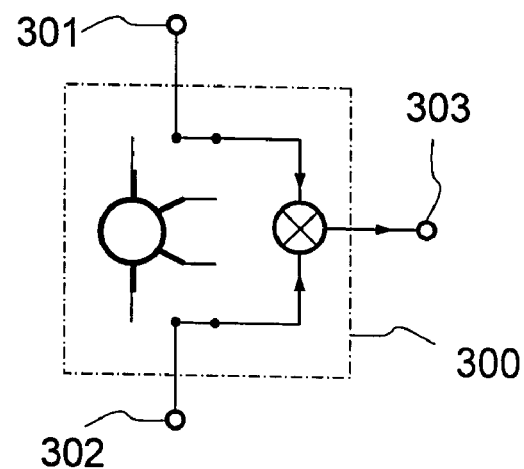
FIG. 9B shows a mixer-arrangement which is configurable by laser fuses, the mixer-arrangement being configured to a pure receive mode of operation.
Figure 9C:
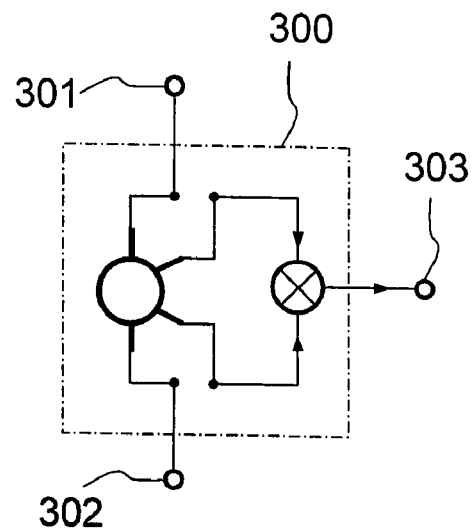
FIG. 9C shows a mixer-arrangement which is configurable by laser fuses, the mixer-arrangement being configured to a combined send-and-receive mode of operation.

The example illustrated in FIGS. 9a, 9b and 9c does not allow a repeatable configuration of the mixer arrangement 300 by means of a control signal, but only a configuration being performed once by fusing laser fuses 350 to 355, or by depositing an optional (maybe final) metallisation layer thus providing the last missing electrical connections. FIG. 9a illustrates the initial configuration, starting from which the arrangement of FIG. 9b or the arrangement of FIG. 9c is produced. The arrangement of FIG. 9b corresponds to the arrangement of FIG. 7a, the arrangement of FIG. 9c corresponds to the arrangement of FIG. 7b.

In order to get a receiving-only mixer (cf. FIG. 7a or FIG. 9b) from the initial configuration, the fuses 350, 352, 353, and 355 have to be fused, for example by a laser-beam during the production process. In order to get a combined transmitting/receiving mixer (cf. FIG. 7b or FIG. 9c), the fuses 351 and 354 have to be fused.

Instead of laser fuses 350 to 355 intermittent signal paths in the metallization layer can be used. At the places, where in the case described above the fuses are not fused, the interruptions of the signal paths are closed by disposing a further metallization at the place of the interruptions in the signal paths (e. g. strip lines).

Figure 10:
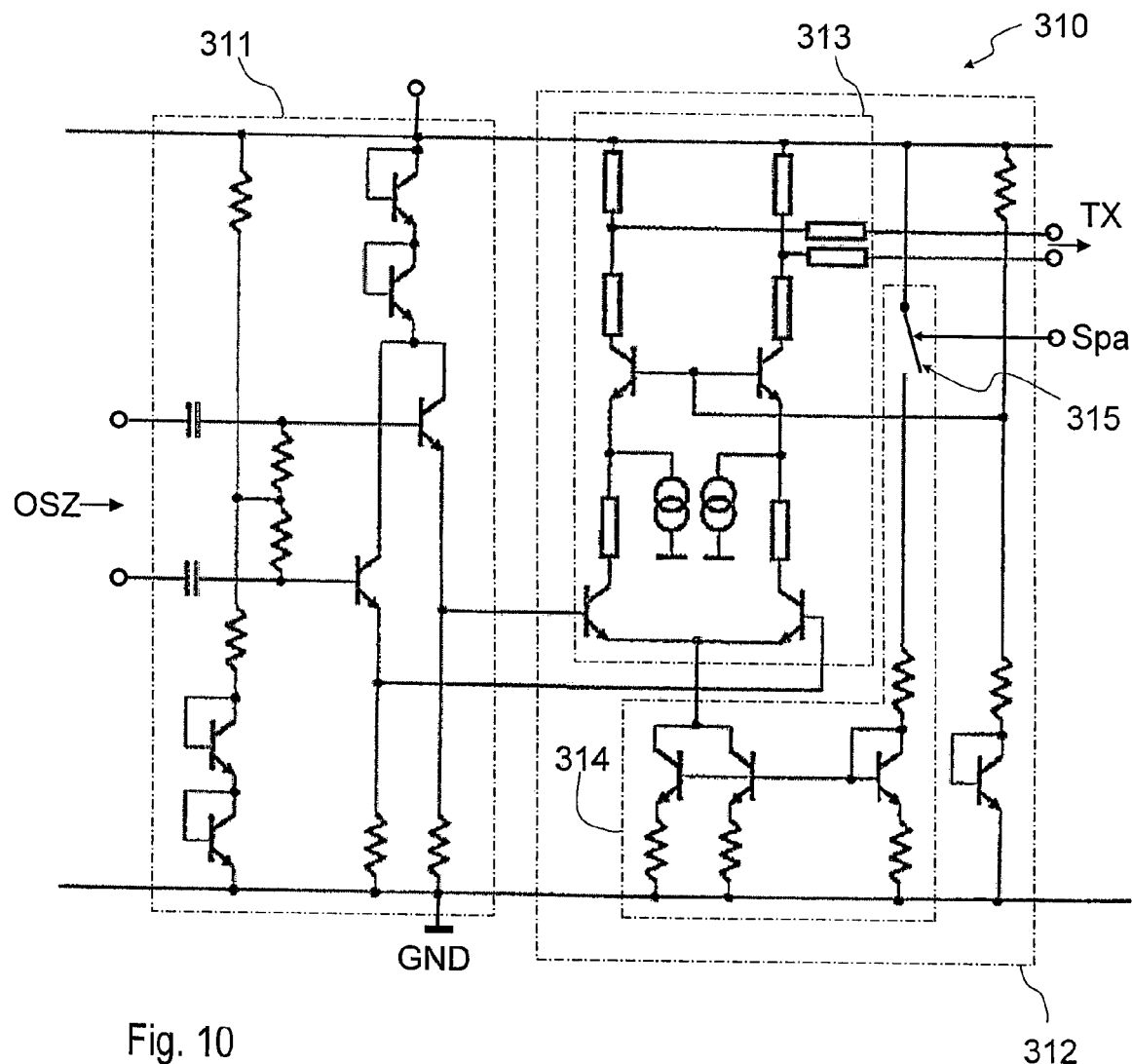
FIG. 10 shows one example of the switchable amplifier of FIG. 8A or 8B.

FIG. 10 illustrates an example of an amplifier which can be activated or deactivated by a control signal Spa. The oscillator signal OSZ and the transmitting signal TX are differential signals, i. e. signals which are not ground related, in the example of FIG. 10. The oscillator signal OSZ is supplied to two corresponding terminals as indicated by the arrow. The first stage 311 of the amplifier is an emitter follower, whose output signal is again amplified by the differential amplifier 313. The current mirror 314 thereby serves as current source for the differential amplifier 313. By switching of the current source the amplifier may be deactivated. In order to do so, for example a switch may be provided which switches off the current in the reference path of the current mirror.314. The output signal (transmitting signal TX) is provided at the two corresponding output terminals as a symmetric differential signal.

FIG. 11 depicts, as one example of the invention, a sender/receiver front-end 120, which has to be understood as a possible alternative or supplement to the sender/receiver front-ends 120 depicted in FIGS. 3 to 5. The transmitting/receiving circuits 123a and 123b of FIGS. 4 and 5 may be replaced by the sending/receiving circuit 123c of FIG. 11, which essentially provide the same function. The sender/receiver front-end 120 of FIG. 11 may comprise an RF-oscillator (e. g. a voltage controlled local oscillator) which provides an oscillating signal OSZ depending on the analog reference signal REF' (cf. FIG. 4). The oscillator signal OSZ is supplied to the distribution unit 122 which distributes the single power, dependent on the mode of operation, to the connected transmitting/receiving circuit. In the present case only one transmitting/receiving circuit 123c is depicted for the sake of simplicity and clarity. Of course two or more transmitting/receiving circuits can be connected to the distribution unit 122 (cf. FIGS. 3 to 5).

The transmitting/receiving circuit 123c comprises an optional filter 125, whose output is connected to one or more of the mixer arrangements 300 described with reference to FIGS. 8a and 8b. Instead of the (multi-output) filter 125 a further distribution unit (RF-splitter) or a simple parallel connection of the mixer arrangements 300 may be used as alternatives. The mixer arrangement is connected with one or more antennas 130 and provides the baseband signals IF0, IF1 by mixing the received signals RX with the oscillator signal OSZ.

One important difference between the present example and the example illustrated in FIGS. 4 and 5 is, that the RF-transmitting signal is not once "centrally" amplified before being distributed to the different signal paths each corresponding to an antenna (as performed, for example, by the circuit 123b of FIG. 4), but the amplification is performed "locally" in each mixer arrangement 300 after the distribution of the un-amplified (low power) RF-transmitting signal. This entails a remarkable improvement of the efficiency of the overall RF front-end 120 and an improvement of flexibility.

Only un-amplified RF signals are distributed to different signal paths and since the amplification is performed in each signal path closely to the antenna, the losses in the splitters, mixers, couplers, etc. are remarkably reduced. Since the mixer arrangements 300 are configurable via a control signal Spa (which may depend or may be deducted from the control signal CT3), the overall system is also improved in terms of scalability. For example, even the antennas can be arranged together with the whole RF front-end on one common lead frame of one common chip package.

If a plurality of such chips are arranged on a PCB-board in a defined distance, a phased-array for digital beam-forming can be easily implemented due to the flexible configurability of the RF front-end.

FIGS. 12a and 12b illustrate the common arrangement of RF sender/receiver front-end 120 and one or more antennas on one common wafer 503 and on one common lead frame 500. The pads 501 connecting the pins of a chip package are connected to the silicon wafer 503 (and with the RF front-end integrated therein) via bond wires 502. Additionally to the RF front-end 120 one or more transmitting and/or receiving antennas are arranged on the wafer 503. In the present example only one antenna is shown for the sake of simplicity and clarity.

Between antenna 130 and silicon wafer 503 a dielectric layer 510, for example a silicon-oxide-layer and/or a silicon-nitride-layer, is arranged. The antenna 130 may be designed as folder deep hole antenna, as patch-antenna, as leaky-wave antenna, etc.

For providing a sufficient emission of radiation from the antenna a cavity 540b can be etched into the silicon layer below the antenna 130. If the radiation should be emitted in the direction towards the lead frame 500, also the lead frame 500 may have a cavity 504a below the antenna. The antenna is then located on a thin membrane comprising the dielectric layer 510 and optionally a thin residual of the silicon layer 503.

The invention claimed is:

1. A mixer arrangement comprising:
    an oscillator terminal for receiving an oscillator signal,
    an RF terminal for connecting an antenna,
    a base-band terminal for providing a base-band signal,
    a mixer having a first input operably coupled to the oscillator terminal, a second input, and an output operably coupled to the base-band terminal,
    a directional coupler operably coupled to oscillator terminal and the RF terminal for coupling the oscillator signal to the antenna and for coupling a signal received from the antenna to the second input of the mixer,
    a disconnecting device configured to interrupt the signal flow from the oscillator terminal to the RF terminal.

2. The mixer arrangement of claim 1, where the disconnecting device comprises at least one laser fuse.

3. The mixer arrangement of claim 1, where the disconnecting device comprises an amplifier which can be activated and deactivated by a control signal.

4. An arrangement for use in an RF transceiver, comprising:
    a terminal operably coupled to receive an oscillator signal,
    at least one distribution unit configured to distribute the oscillator signal into different signal paths,
    two or more mixer arrangements configured to send a transmit signal or receive a receive signal, each mixer arrangement is operably coupled in one of the different signal paths, each mixer arrangement comprising a mixer and an amplifier configured to amplify the oscillator signal, and
    at least one transmit signal path between the amplifier and an antenna and configured to bypass the mixer.

5. The arrangement of claim 4, further comprising a directional coupler having a first input coupled to the amplifier, a first output coupled to the mixer, and a second input/output coupled to the antenna.

6. The arrangement of claim 4, further comprising at least one receive mixer signal between the amplifier and the mixer.

7. The arrangement of claim 4, further comprising an oscillator coupled to the terminal.

8. The arrangement of claim 4, wherein the amplifier can be controllably enabled and disabled.

9. An arrangement for use in an RF transceiver, comprising:
    a terminal operably coupled to receive an oscillator signal,
    at least one distribution unit configured to distribute the oscillator signal into different signal paths,
    two or more mixer arrangements configured to send a transmit signal or receive a receive signal, each mixer arrangement is operably coupled in one of the different signal paths, each mixer arrangement comprising a mixer and an amplifier configured to amplify the oscillator signal, and
    wherein the arrangement is integrated in one semiconductor body.

10. The arrangement of claim 9, wherein:
    a first mixer arrangement is coupled in a first of the different signal paths and is configured to transmit or receive RF signals in a first frequency band; and
    a second mixer arrangement is coupled in a second of the different signal paths and is configured to transmit or receive RF signals in a second frequency band that is different than the first frequency band.

11. The arrangement of claim 10, wherein the first frequency band is employed for near area radar location, and the second frequency band is employed for far area radar location.

12. The arrangement of claim 10, wherein the amplifier can be controllably enabled and disabled.

13. The arrangement of claim 9, further comprising an oscillator coupled to the terminal.

14. The arrangement of claim 9, wherein the amplifier can be controllably enabled and disabled.

* * * * *